United States Patent
Kurachi et al.

(10) Patent No.: US 6,911,924 B2
(45) Date of Patent: Jun. 28, 2005

(54) ANALOG UNIT SYSTEM

(75) Inventors: Haruyuki Kurachi, Tokyo (JP);
Shigeaki Takase, Tokyo (JP); Tatsuya Akahori, Tokyo (JP); Hiroshi Kobayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/475,645

(22) PCT Filed: Jan. 31, 2002

(86) PCT No.: PCT/JP02/00738
§ 371 (c)(1),
(2), (4) Date: Oct. 23, 2003

(87) PCT Pub. No.: WO03/065588
PCT Pub. Date: Aug. 7, 2003

(65) Prior Publication Data
US 2004/0150455 A1 Aug. 5, 2004

(51) Int. Cl.[7] .............................................. H03M 1/10
(52) U.S. Cl. ...................................... 341/120; 341/155
(58) Field of Search ............................... 341/120, 155, 341/156, 118, 126

(56) References Cited

U.S. PATENT DOCUMENTS 6,031,175 A * 2/2000 Tozuka ........................ 84/610
6,134,575 A * 10/2000 Lee ............................ 345/764
6,449,517 B1 * 9/2002 Lee ............................. 700/83
2003/0052984 A1 * 3/2003 Schinner ................ 348/333.01

FOREIGN PATENT DOCUMENTS

JP 2001-34447 A 2/2001

* cited by examiner

Primary Examiner—Michael Tokar
Assistant Examiner—John B Nguyen
(74) Attorney, Agent, or Firm—Sughrue Mion, PLLC

(57) ABSTRACT

An analog unit system according to this invention comprises a first analog unit having first storage means for storing a first factory setting value and a first user setting value, second storage means for reading the first factory setting value and the first user setting value out of the first storage means and storing the setting values, operation means for calculating a second user setting value based on the first factory setting value and the first user setting value read out of the second storage means, and a second analog unit having third storage means for storing the second user setting value calculated by this operation means and thereby, adjustment and calibration of the user setting value can automatically be performed by simple manipulation with respect to the analog unit in which the user setting value is not set.

8 Claims, 12 Drawing Sheets

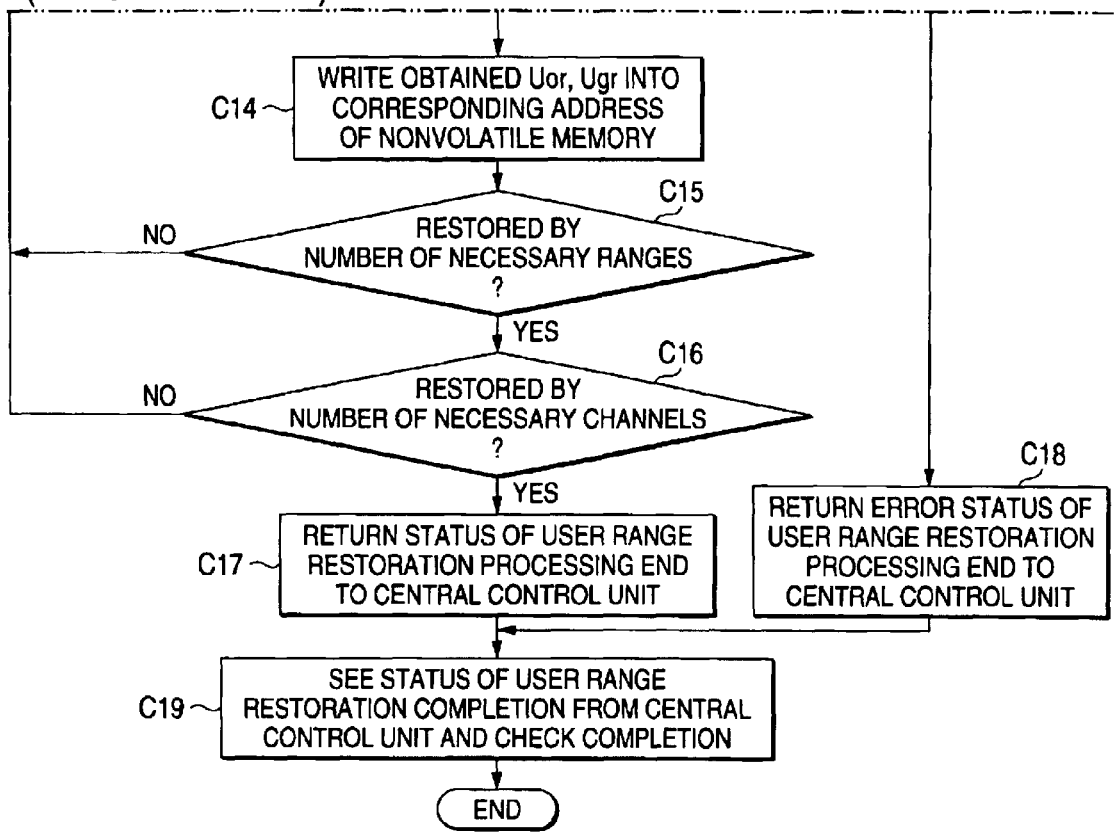

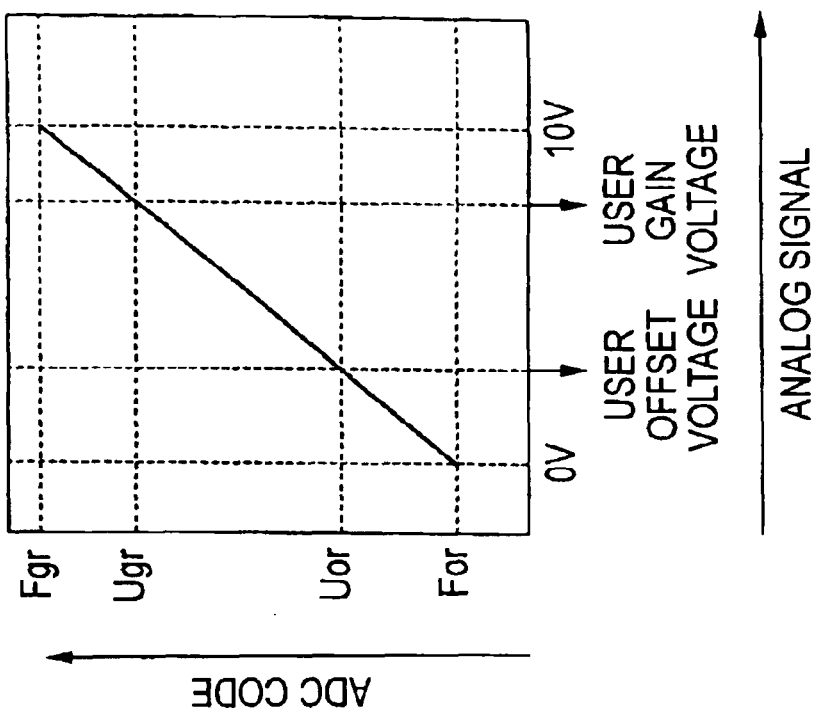
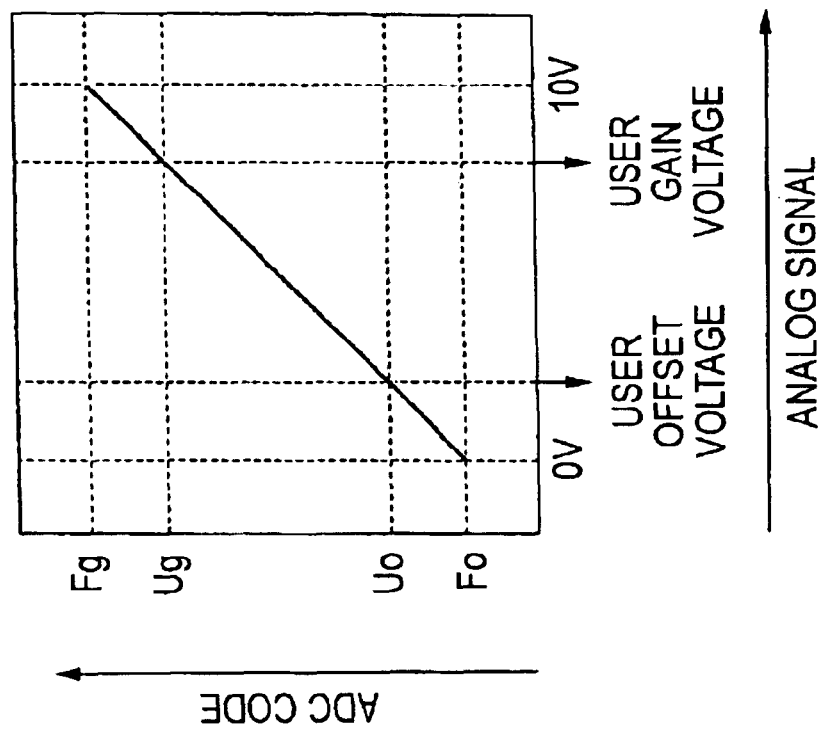

ANALOG UNIT SYSTEM

This application is a continuation of international application of a 371 of PCT/JP02/00738 filed Jan. 31, 2002.

1. Technical Field

This invention relates to an analog unit, and particularly to automatic calibration and adjustment of its parameter.

2. Background Art

Units called an analog unit broadly are generally classified into an A/D conversion unit and a D/A conversion unit.

The A/D conversion unit inputs a voltage or a current and converts the voltage or the current into a digital output value.

The D/A conversion unit specifies a digital value and outputs a voltage or a current corresponding to its value.

In this description below, the case of the A/D conversion unit, namely the unit for making conversion from an analog value into a digital value will be described as the analog unit mainly.

Conventionally, at the time of adjustment or replacement, etc. of the A/D conversion unit, a professional engineer has performed calibration manually every one channel. The channel means one functional unit among plural A/D conversion circuits present in one A/D conversion unit and, for example, in the case of an A/D conversion unit for sequencer, A/D conversion circuits of four to eight channels are had in one unit.

The reason why the calibration is necessary is because A/D conversion characteristics every channel differ. The reason why the conversion characteristics differ is because there are variations in characteristics in individual parts forming the A/D conversion circuit.

The calibration of the A/D conversion unit means that adjustment is made so as to output a particular digital output value when a certain analog value such as a voltage or a current is inputted.

A unit in which, for example, 0 to 10 V is inputted and a digital value of 0 to 4000 is outputted as the A/D conversion unit is taken as an example.

First, an analog unit system acting as a part of, for example, a conventional FA system and a flow of a signal in its system are shown in FIG. 13. In the following description, the case that an analog input signal is a voltage is assumed, but the case of a current is also similar.

In FIG. 13, an A/D conversion unit (hereinafter written as a unit properly) 104 is a unit for inputting an analog signal and outputting a digital signal. A central control unit 5 such as a sequencer controls the entire FA system including the A/D conversion unit 104. Temporary memory 6 of the inside of the central control unit 5 has sequence program memory 6a for holding a sequence program for control and device memory 6b for holding, namely storing other data (for example, a digital output value outputted from the A/D conversion unit 104).

An A/D conversion circuit 1 in the A/D conversion unit 104 inputs an analog signal from the outside and converts the analog signal into a digital signal (ADC code) to produce an output.

Scaling means 2 makes conversion from the inputted ADC code into a digital value of an easy-to-process form. For example, when a digital output value with an input of 1 to 5 V wants to be outputted in the range of 0 to 4000, a digital output value corresponding to the present voltage is outputted from an ADC code at the time of 1 V as an offset voltage, an ADC code at the time of 5 V as a gain voltage and an ADC code of the voltage inputted at present.

Nonvolatile memory 3 stores an ADC code at the time of applying the offset voltage and an ADC code at the time of applying the gain voltage, and sees the scaling means 2 at the time of performing scaling processing.

As shown in FIG. 13, the A/D conversion unit 104 normally has the A/D conversion circuit 1 and the scaling means 2, and preserves a factory offset value Fo, a factory gain value Fg set in a factory at the time of production of the A/D conversion units and a user offset value Uo, a user gain value Ug set in the field in which a user uses in the nonvolatile memory 3 as an ADC code (hereinafter written as an offset value properly) outputted at the time of applying the lowest offset voltage of specifications used in scaling and an ADC code (hereinafter written as a gain value properly) outputted at the time of applying the highest gain voltage, and by the scaling means 2, the offset values and the gain values are outputted to digital values of 0 to 4000 and are held in the device memory 6b in the temporary memory 6 of the central control unit 5 and are seen at the time of some processing of the system according to the sequence program 6a.

Here, an offset voltage and a gain voltage are defined. The offset voltage means a value of the lowest voltage of voltages inputted in a particular channel of the A/D conversion unit and an input voltage in which the lowest value, for example, an output value 0 of the case of being scaled from 0 to 4000 is outputted as a digital output value in correspondence with the input voltage value. The gain voltage means a value of the highest voltage of voltages inputted in the particular channel and an input voltage in which the highest value, for example, an output value 4000 of the case of being scaled from 0 to 4000 is outputted as a digital output value in correspondence with the input voltage value.

That is, when a range of the inputted voltage is 0 to 5 V, the offset voltage becomes 0 V and the gain voltage becomes 5 V.

Here, the scaling means 2 will be described. In the scaling means 2, an ADC code Iadc in proportion to a voltage applied to the A/D conversion circuit 1 is received as an input value and the user offset value Uo and the user gain value Ug are seen from the nonvolatile memory 3. Further, the minimum value and the maximum value at the time of scaling and output are set to So and Sg, respectively. A digital output value Sd outputted from the scaling means 3 is obtained by the following formula.

$$Sd=(Iadc-Uo)/(Ug-Uo)*Sg+So \qquad \text{formula (1)}$$

However, in the formula (1) described above, Uo is a user offset value and Ug is a user gain value and Iadc is a value (ADC code) outputted from the A/D conversion circuit and Sd is a value (digital output value) after scaling calculation and Sg is the maximum value at the time of scaling (Sg+So is the maximum value when So is not 0) and So is the minimum value at the time of scaling, respectively.

Generally, in a scaling range (for example, 0 to 4000), the minimum value is 0, so that the value Sd is obtained by the following formula excluding a term of So from the formula (1).

$$Sd=(Iadc-Uo)/(Ug-Uo)*Sg \qquad \text{formula (2)}$$

By this formula (2), when an input voltage is an offset voltage, an ADC code is Uo, so that the first term becomes 0 and the minimum value So at the time of scaling becomes the digital output value. When an input voltage is a gain voltage, an ADC code is Ug, so that the first term becomes 1 and Sg becomes the digital output value.

That is, the first term shows a value of 0 to 1 when the ADC code is in the range of Uo to Ug, and by multiplying this by Sg, linear conversion is implemented.

For example, in an apparatus shown in FIG. 13, in the case of outputting a digital output value of 0 to 4000, when it is assumed that Uo is 890 and Ug is 4050 and an ADC code inputted is 1680, a digital output value to be outputted is as follows in the case of doing calculation using the formula (5) described above.

(1680−890)/(4050−890)*4000=1000

The reason why the scaling means 2 is necessary is because individual A/D conversion circuits 1 have variations in characteristics and the variations are absorbed. For example, when a channel 1 in which an ADC code outputted at the time of applying a voltage outputs 100 in the case of applying 0 V and outputs 8000 in the case of applying 10 V and a channel 2 in which the ADC code outputs 105 in the case of applying 0 V and outputs 8020 in the case of applying 10 V are present, an offset value and a gain value of the channel 1 are set to 100 and 8000 and an offset value and a gain value of the channel 2 are set to 105 and 8020 and scaling of 0 to 4000 is performed and thereby, a digital output value of 0 is outputted when an offset voltage of 0 V is applied to any of the channels and a digital output value of 4000 is outputted when a gain voltage of 10 V is applied. That is, the variations in characteristics of individual A/D conversion circuits can be absorbed by the scaling processing.

In order to perform this scaling processing and absorb the variations, it is necessary to measure the characteristics of individual A/D conversion circuits and decide and preserve a user offset value, a user gain value.

Now, the case that, for example, an output from a variable voltage generator 7 is inputted to the A/D conversion unit 104 as shown in FIG. 13 with respect to setting of the user offset value and the user gain value will be described.

A procedure manipulated by a user is shown in FIG. 14.

First, in step a1, the central control unit 5 is shifted to a STOP state-by user instructions. Next, in step a2, the A/D conversion unit 104 is shifted to an offset and gain setting mode by user instructions. When the A/D conversion unit 104 shifts to the offset and gain setting mode, in step a3, a user manipulates the variable voltage generator 7 and applies an offset voltage.

In the inside of the unit 104, the offset voltage is received and is inputted to the A/D conversion circuit 1 to output a corresponding ADC code.

Then, in step a4, a user offset value is set by user instructions. In the inside of the unit 104, the ADC code outputted at present is written into an area corresponding to a user offset value Uo of the nonvolatile memory 3.

Then, in step a5, the user manipulates the variable voltage generator 7 and applies a gain voltage. At this time, in the inside of the unit, the gain voltage is received and is inputted to the A/D conversion circuit 1 to output a corresponding ADC code.

In the inside of the unit 104, the ADC code outputted at present is written into an area corresponding to a user gain value Ug of the nonvolatile memory 3 (step a6).

The above manipulations are repeated by the number of channels present inside the A/D conversion unit 104 (step a7).

When setting of all the channels is completed, the A/D conversion unit 104 is shifted to a normal mode by user instructions (step a8). By being shifted to the normal mode, in the inside of the unit 104, the user offset value and the user gain value set newly are seen and scaling processing is performed and a digital output value as set can be outputted.

Then, in step a9, the entire system operates again by shifting the central control unit 5 to a RUN state by user instructions.

In the conventional adjustment and calibration work described above, analog-to-digital conversion characteristics every channel differ at the time of unit adjustment, so that it was necessary for a professional engineer to make adjustment by switch manipulations manually every one channel and the work was work in which the manipulations are also troublesome and a lot of time is expended.

Also, at the time of unit replacement etc. in operation of an FA system after incorporating the unit into the FA system once, there were often cases that a professional engineer for unit adjustment is absent in the vicinity of the field of installation and in the case that a general user makes adjustment and calibration, efficiency was bad and accurate adjustment was difficult.

Also, during the adjustment and calibration, it was necessary to stop the FA system all over or over a considerably wide extent and there was also fear that damage associated with the stop of the FA system becomes large.

Therefore, this invention is implemented to solve the problems as described above, and an object of the invention is to provide an analog unit in which at the time of unit adjustment etc., a stop of a system such as an FA system is limited to a part and the entire system is not stopped and a user (operator) performs adjustment and calibration of an actually used user offset value and a user gain value of a unit automatically and speedily by simple manipulation without expertise and can adjust the actually used user offset value and the user gain value of the unit in a short time and also at the time of unit replacement etc., adjustment and calibration of a new unit are performed automatically and speedily and contribution to an increase in operating efficiency of the entire system can be made.

DISCLOSURE OF THE INVENTION

This invention provides an analog unit system including a first analog unit having first storage means for storing a first factory setting value and a first user setting value, and second storage means for reading the first factory setting value and the first user setting value out of the first storage means and storing the setting values.

Therefore, at the time of analog unit adjustment etc., the first factory setting value and the first user setting value stored in the first storage means of the first analog unit can be stored in the separate second storage means, and the first factory setting value and the first user setting value can be utilized through the second storage means regardless of a state of the first analog unit.

Also, this invention provides an analog unit system including a first analog unit having first storage means for storing a first factory setting value and a first user setting value, second storage means for reading the first factory setting value and the first user setting value out of the first storage means and storing the setting values, operation means for calculating a second user setting value based on the first factory setting value and the first user setting value read out of the second storage means, and a second analog unit having third storage means for storing the second user setting value calculated by this operation means.

Therefore, adjustment and calibration of the user setting value can automatically be performed by simple manipulation with respect to the analog unit in which the user setting value is not set, and also at the time of replacement etc. of the analog unit, adjustment and calibration of a new analog unit can automatically be performed, and further at the time of this adjustment and calibration, adjustment and calibration of the analog unit system of a target can be performed without stopping the entire system, so that operating efficiency of the entire analog unit system can be increased.

Also, this invention provides an analog unit system in which there are a plurality of second analog units and a second user setting value is supplied to this plurality of second analog units in a batch manner.

Therefore, in the case etc. of mounting plural A/D conversion units into one analog unit system and making user range setting of the same contents in large amounts, the user range setting can be made simultaneously in a batch manner with respect to the plural A/D conversion units, and a reduction in time and laborsaving of user range setting work of the entire analog unit system can be achieved. This has the large effect as the system with a large number of A/D conversion units becomes large.

BRIEF DESCRIPTION OF THE DRAWINGS

FIGS. 4A and 4B are graphs showing a relation between an offset voltage, a gain voltage inputted and an offset value, a gain value.

BEST MODE FOR CARRYING OUT THE INVENTION

First Embodiment

Figure 1:
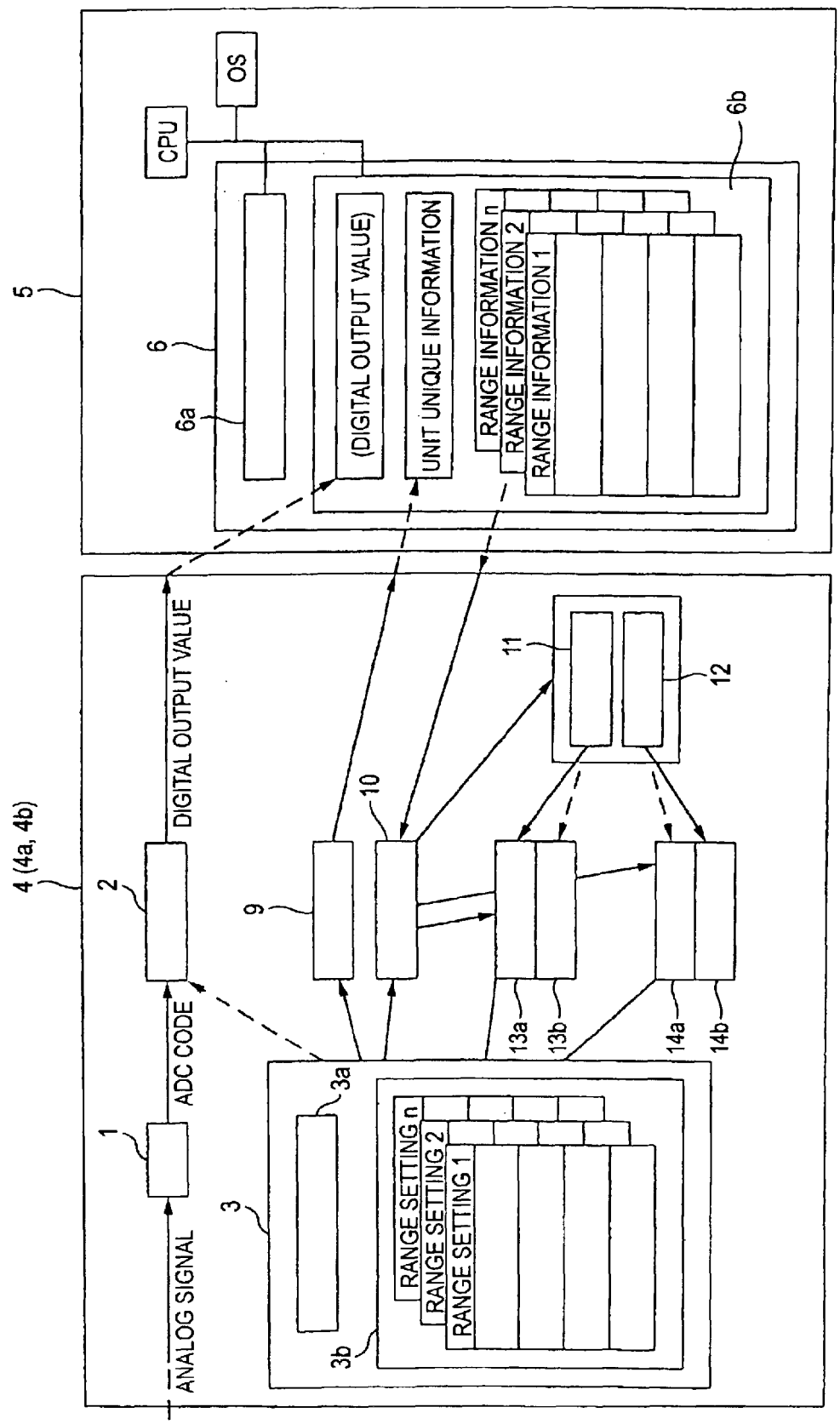
FIG. 1 is a block diagram showing an analog unit system according to a first embodiment of this invention.

Preferred embodiments of this invention will be described using the drawings. FIG. 1 is a block diagram showing an analog unit system according to a first embodiment of this invention. Main components in the drawing will be described briefly.

An A/D conversion circuit 1 converts an analog input signal into an ADC code. Scaling means 2 converts the ADC code into a digital output value.

Nonvolatile memory 3 holds a user offset value, a user gain value, a factory offset value and a factory gain value seen by the scaling means 2.

Saving range selection means 9 selects which range is saved when saving is instructed. Restoration range selection means 10 selects which range is restored when restoration is instructed.

An input range means a range of an analog value available in one channel of an A/D conversion unit and is shown by an offset voltage and a gain voltage. For example, in the case of an input range of a range of 0 to 5 V, an offset value becomes 0 V and a gain value becomes 5 V.

Offset correction formula selection means 11 selects which offset correction formula is used when restoration is instructed. Gain correction formula selection means 12 selects which gain correction formula is used when restoration is instructed.

First offset correction calculation means 13a and second offset correction calculation means 13b respectively correct and calculate a user offset value Uor present in the channel of the unit from a factory offset value Fo, a factory gain value Fg, a user offset value Uo of a succession origin and a factory offset value For, a factory gain value Fgr held in the nonvolatile memory 3 when restoration is instructed.

First gain correction calculation means 14a and second gain correction calculation means 14b respectively correct and calculate a user gain value Ugr present in the channel of the unit from a factory offset value Fo, a factory gain value Fg, a user gain value Ug of a restoration origin and a factory offset value For, a factory gain value Fgr held in the nonvolatile memory 3 when restoration is instructed.

In a manner similar to a conventional A/D conversion unit 104, an A/D conversion unit 4 according to this embodiment has the A/D conversion circuit 1, the scaling means 2 and the nonvolatile memory 3, and a digital output value is held in device memory 6b in temporary memory 6 of a central control unit 5 such as a sequencer.

Incidentally, in the nonvolatile memory 3, unit unique information 3a is recorded by one per unit and range setting information 3b is recorded by the number of ranges capable of selection and setting to one channel and a factory offset value Fo, a factory gain value Fg, a user offset value Uo and a user gain value Ug are recorded by the number of input ranges by the number of channels.

The unit unique information 3a is information for identifying models of the central control unit 5 and a unit present on the system by allocating the same numeric value to the same model and allocating a different numeric value to a different model, for example, 1 for a model A and 2 for a model B.

In the range setting information 3b, unique numeric values are allocated by the number of input ranges capable of selection and setting to one channel. Normally, the numeric values are serial numbers starting from 0 or 1. In the serial numbers, for example, a range of 0 to 10 V is allocated to 0 and a range of 1 to 5 V is allocated to 1 and a range of 0 to 5 V is allocated to 2.

In the A/D conversion unit 4 according to this embodiment, a unit A in which a user offset value and a user gain value are set already and an unit B in which the values are not set yet are prepared.

Figure 2:
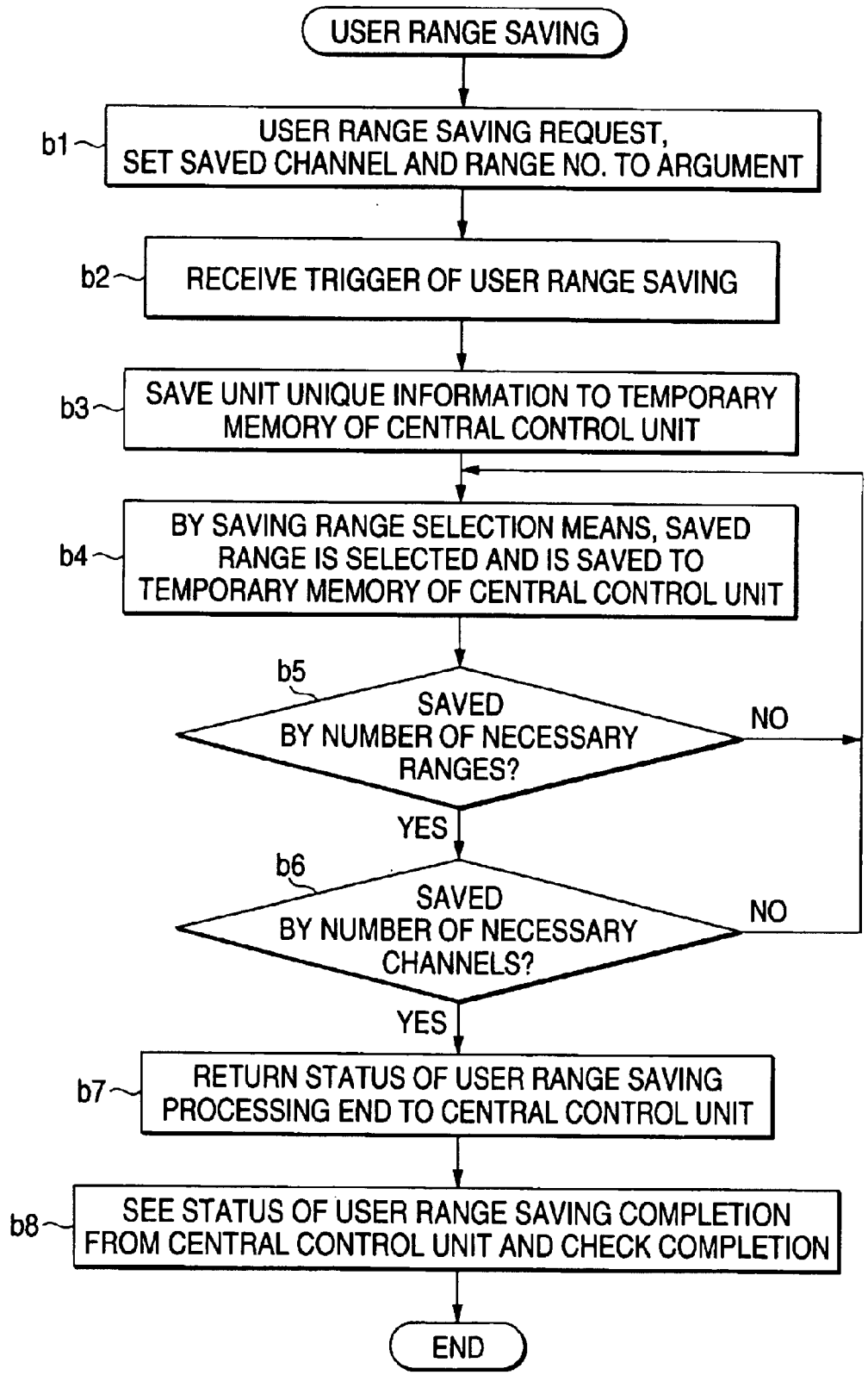
FIG. 2 is a flowchart showing a procedure of user range saving according to the first embodiment of this invention.

FIG. 2 is a flowchart showing a procedure of user range saving. Incidentally, for simplification of description, in the flowchart of FIG. 2, items such as updating of a range No. or the number of channels to be naturally processed are omitted from the flowchart.

In order to save, that is, move and store user range setting of a user offset value, a user gain value, etc. which are ADC codes from an A/D conversion unit 4a (unit A) in which the user offset value and the user gain value are set already to the temporary memory 6 of the central control unit 5, in FIG. 2, in step b1, a user first makes a user range saving request via the central control unit 5. In this case, for example, a saved channel and a range No. are held as an argument with respect to a device (memory in which both of the A/D conversion unit and the central control unit 5 can perform readout and writing) capable of holding a numeric value present in the A/D conversion unit 4a. Next, in step b2, the A/D conversion unit 4 receives a trigger of user range saving from the central control unit 5 in order to provide timing of a start of saving processing. Then, in step b3, the unit unique information 3a is first saved to the temporary memory 6 of the central control unit 5. This processing is performed to prevent writing of the wrong user range in error in the case of mounting a unit of the wrong other model at the time of user range restoration.

Then, in step b4, by the saving range selection means 9, the saved channel and the range No. held by a procedure of step b1 are seen and a saved range is selected and is saved to the temporary memory 6 of the central control unit 5. Saved data is a factory offset value Fo, a factory gain value Fg, a user offset value Uo, a user gain value Ug of the corresponding range and the range No. The reason why the range No. is included in the saved data is because all the input range data had by the unit are not saved and data is limited to only an input range necessary actually and the amount of transfer data is minimized.

Then, in step b5, it is decided whether or not data is saved by the number of necessary input ranges. This is because only data corresponding to the necessary input range is saved. When the necessary input range remains still, processing from step b4 is continued.

Then, in step b6, it is determined whether or not data is saved by the number of necessary channels. When it is not performed by the number of channels yet, processing from step b4 is continued. Then, in step b7, the A/D conversion unit 4a returns a status of the user range saving processing end to the central control unit 5.

Finally, in step b8, the user sees a status of the user range saving completion from the central control unit 5 and checks the completion of user range saving.

By the above processing, saving of the user range is executed and the unit unique information from the A/D conversion unit 4a, range information 1 to n and information necessary to restore the user range are held in the device memory 6b of the central control unit 5.

Figure 3:
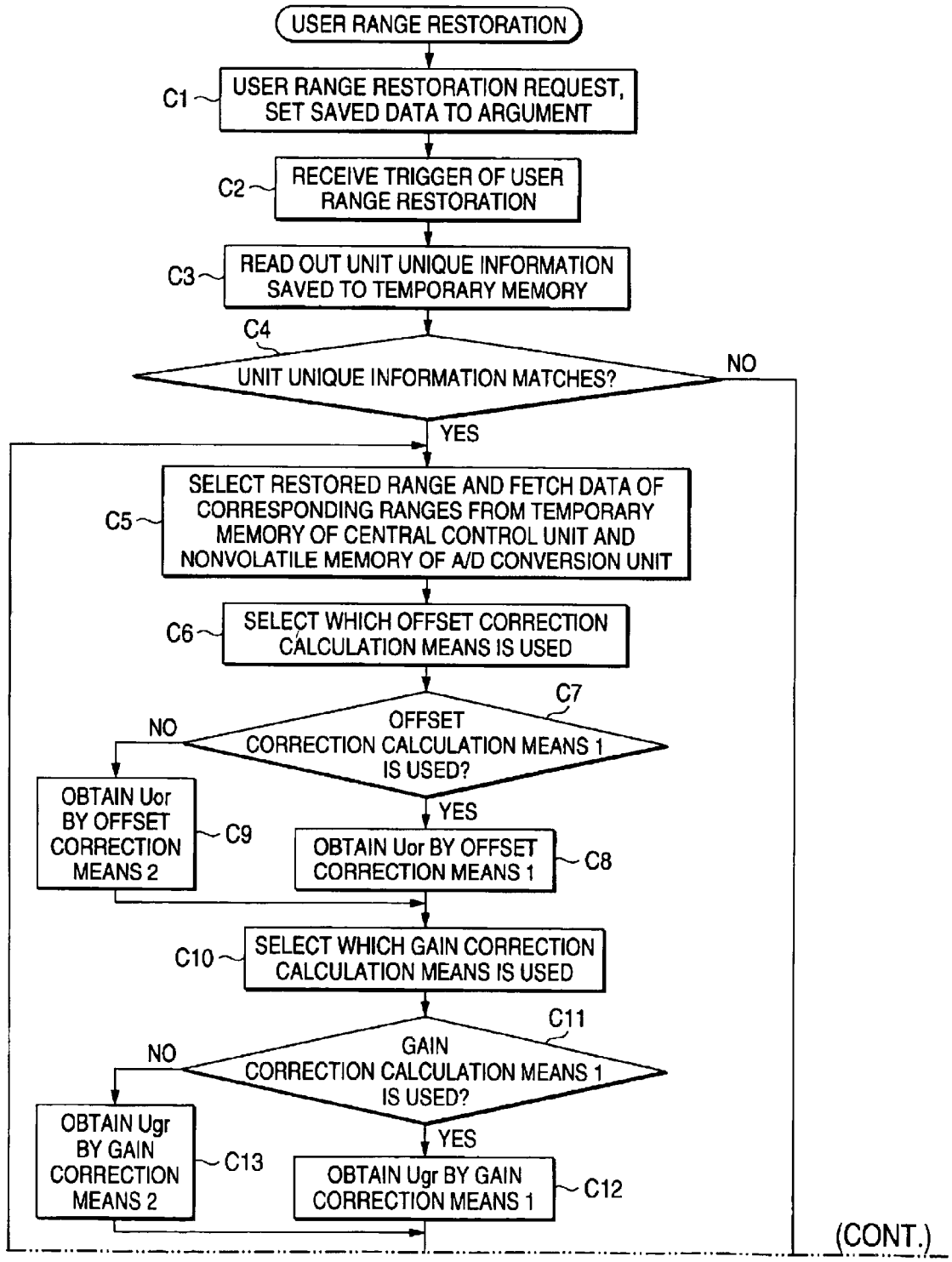
FIG. 3 is a flowchart showing a procedure of user range restoration according to the first embodiment of this invention.

FIG. 3 is a flowchart showing a procedure of user range restoration. Incidentally, for simplification of description, in the flowchart of FIG. 3, items such as updating of a range No. or the number of channels to be naturally processed are omitted from the flowchart. Here, it is assumed that setting and storing of a user range into an A/D conversion unit with no setting is called restoration.

In the following description, r is added to all the ends of a factory offset value For, a factory gain value Fgr, a user offset value Uor, a user gain value Ugr held in the nonvolatile memory 3 of an A/D conversion unit 4b (unit B) in which a user range is restored for the purpose of distinguishing from data saved, namely previously stored in the temporary memory 6 etc.

Incidentally, the factory offset value For and the factory gain value Fgr are preset uniquely to the A/D conversion unit 4b.

In order to restore a user offset value to the A/D conversion unit 4b in which a user offset value and a user gain value are not set, in FIG. 3, in step c1, a user first makes a user range restoration request via the central control unit 5. In this case, for example, saved data is set to an argument with respect to a device (memory in which both of the A/D conversion unit 4b and the central control unit 5 can perform readout and writing) capable of holding a numeric value present in the A/D conversion unit 4b. Next, in step c2, the A/D conversion unit 4b receives a trigger of user range restoration from the central control unit 5 such as a sequencer in order to provide timing of a start of restoration processing. Then, in step c3, the A/D conversion unit 4b first reads out the unit unique information 3a previously stored in the temporary memory 6 of the central control unit 5. Then, in step c4, the A/D conversion unit 4b reads out and compares unit unique information stored in the device memory 6b saved similarly with unit unique information stored in the side of A/D conversion unit 4b and thereby decides whether or not both the unit unique information match. When both the unit unique information differ, a user range of the unit of a different model attempts to be restored, so that in this case, the flowchart proceeds to step c18 and the A/D conversion unit 4b executes return of an error status of the user range restoration processing end to the central control unit 5 and subsequently in step c19, the user sees a status of the user range restoration completion from the central control unit 5 and checks the completion of restoration processing.

In the case of mounting the unit of a different model, the completion is reached without executing the restoration processing, so that when necessary, the user mounts an exact A/D conversion unit to be restored in the system and thereafter again performs a procedure of user range restoration from the beginning (step c1).

On the other hand, when the unit unique information stored in the side of the central control unit 5 matches with the unique information stored in the side of A/D conversion unit 4b and is exact in step c4, the flowchart proceeds to step c5 and by the restoration range selection means 10, an input range restored is selected and Fo, Fg, Uo, Ug compatible with corresponding input ranges are fetched from the temporary memory 6 of the central control unit 5 and also For and Fgr of corresponding ranges are fetched from the nonvolatile memory 3 of the A/D conversion unit 4b.

Then, in step c6, the offset correction formula selection means 11 sees a factory offset value Fo, a factory gain value Fg, a user offset value Uo, a user gain value Ug and selects more proper means as to which of the first offset correction calculation means 13a or the second offset correction calculation means 13b is used.

In this processing, in order to minimize an error included in a resultant user offset value Uor, the offset correction formula selection means 11 selects the optimum offset correction calculation means. As to which offset correction calculation means is selected, detailed description will be made below.

Then, in step c7, the offset correction formula selection means 11 decides whether the first offset correction calculation means 13a is used or not and when it is used, the flowchart proceeds to step c8 and Uor is obtained by the first offset correction calculation means 13a. When the first offset correction calculation means 13a is not used, the flowchart proceeds to step c9 and Uor is obtained by the second offset correction calculation means 13b. As to how to obtain the user offset value Uor, description will be made below.

Then, in step c10, the gain correction selection means 12 selects more proper means as to which of the first gain correction calculation means 14a or the second gain correction calculation means 14b is used by the gain correction formula selection means 12. In this processing, the optimum gain correction means is selected in order to minimize an error included in a user gain value Ugr in a manner similar to the processing in step c6.

Then, in step c11, the gain correction formula selection means 12 decides whether the first gain correction calculation means 14a is used or not and when the first gain correction calculation means 14a is used, the flowchart proceeds to step c12 and Ugr is obtained by the first gain correction calculation means 14a. On the other hand, when the first gain correction calculation means 14a is not used, the flowchart proceeds to step c13 and Ugr is obtained by the second gain correction calculation means 14b. As to how to obtain the user gain value Ugr, description will be made below.

Then, in step c14, the obtained Uor, Ugr are written into a corresponding address in the nonvolatile memory 3 of the A/D conversion unit 4b.

Then, in step c15, the A/D conversion unit 4b decides whether or not it is restored by the number of necessary input ranges and when the necessary input range remains still, processing from step c5 is continued.

When all the necessary input ranges have already been processed, the A/D conversion unit 4b decides whether or not it is restored by the number of necessary channels (step c16) and when the necessary channel remains still, also in this case, processing from step c5 is continued.

When all is ended, in step c17, the A/D conversion unit 4b returns a status of the user range restoration processing end to the central control unit 5.

Then, in step c19, the user sees a status of the user range restoration completion from the central control unit 5 and checks the completion of user range restoration.

By a series of the above processing, restoration of the user range is executed and the user offset Uor and the user gain Ugr are held in the nonvolatile memory 3 of the A/D conversion unit 4b and subsequently, the Uor, Ugr are seen and the scaling means 2 is processed.

Next, a concrete calculation method of the user offset value Uor and the user gain value Ugr will be described.

A factory offset value Fo, a factory gain value Fg, a user offset value Uo and a user gain value Ug of the A/D conversion unit 4a (unit A) saved to the central control unit 5 by the method shown in the procedure of FIG. 2 are prepared. Further, a factory offset value For and a factory gain value Fgr are prepared by the A/D conversion unit 4b (unit B).

The Fo, Fg, Uo, Ug are present in the device memory 6b of the central control unit 5, so that, for example, they are given to the A/D conversion unit by performing writing with respect to a storage device (memory in which both of the A/D conversion unit and the central control unit 5 can perform readout and writing) in the A/D conversion unit.

The For, Fgr are held in the nonvolatile memory 3 in the A/D conversion unit for executing user range restoration, so that it is seen.

Since the factory offset value Fo, the factory gain value Fg of the A/D conversion unit 4a (unit A) and the factory offset value For, the factory gain value Fgr of the A/D conversion unit 4b (unit B) have the same range setting set at the time of factory shipment, when the same voltage is applied, the same value is outputted in a digital output value outputted from the scaling means 2 finally. That is, when an offset voltage is applied to the unit A, an ADC code outputted from the A/D conversion circuit 1 becomes Fo and when an offset voltage is applied to the unit B, the ADC code becomes For.

Similarly, when a gain voltage is applied, an ADC code of Fg is outputted in the unit A and an ADC code of Fgr is outputted in the unit B.

A ratio between an offset value, a gain value of factory setting and an offset value, a gain value of user setting is equal in the unit A of a succession origin and the unit B of a succession destination, so that a relation of the following formulas holds.

$$(Uo-Fo)/(Fg-Fo)=(Uor-For)/(Fgr-For) \quad\quad \text{formula (3)}$$

$$(Ug-Fo)/(Fg-Fo)=(Ugr-For)/(Fgr-For) \quad\quad \text{formula (4)}$$

When Uor, Ugr are obtained from here, the following formulas are acquired.

$$Uor=(Uo-Fo)*(Fgr-For)/(Fg-Fo)+For \quad\quad \text{formula (5)}$$

$$Ugr=(Ug-Fo)*(Fgr-For)/(Fg-Fo)+For \quad\quad \text{formula (6)}$$

That is, a user offset value and a user gain value unique to the succession destination unit, namely the unit B can be obtained by correction formulas shown in the formulas (5), (6) from the given parameters Fo, Fg, Uo, Ug, For, Uor.

Or, since the following relation also holds, $$(Fg-Uo)/(Fg-Fo)=(Fgr-Uor)/(Fgr-For) \quad\quad \text{formula (7)}$$

$$(Fg-Ug)/(Fg-Fo)=(Fgr-Ugr)/(Fgr-For) \quad\quad \text{formula (8)}$$

From here, Uor, Ugr can be obtained also in the following formulas for obtaining Uor, Ugr.

$$Uor=Fgr-(Fg-Uo)*(Fgr-For)/(Fg-Fo) \quad\quad \text{formula (9)}$$

$$Ugr=Fgr-(Fg-Ug)*(Fgr-For)/(Fg-Fo) \quad\quad \text{formula (10)}$$

In order to obtain a user offset value Uor, Uor can be obtained using any of the formula (5) and the formula (9). Also, in order to obtain a user gain value Ugr, Ugr can be obtained using any of the formula (6) and the formula (10).

The formula (5), formula (6), formula (9) and formula (10) mentioned above will be described.

FIGS. 4A and 4B show a relation between an offset voltage, a gain voltage and an offset value, a gain value by a graph.

FIGS. 4A and 4B are graphs in which an ADC code is taken as the axis of ordinate and an analog input signal is taken as the axis of abscissa. Here, in the analog input signal, a voltage is taken as an example. The ADC code increases linearly as the voltage increases.

At the time of factory shipment, a factory offset voltage is applied and an ADC code at that time is set to a factory offset value Fo. Also, an ADC code at the time of applying a factory gain voltage is set to a factory gain value Fg. In the case of this drawing, the factory offset voltage is set to 0 V and the factory gain voltage is set to 10 V.

Also, an ADC code at the time when a user applies a user offset voltage in the field is set to a user offset value Uo, and an ADC code at the time when the user applies a user gain voltage is set to a user gain value Ug. For the unit A, Fo, Fg, Uo, Ug are used and for the unit B, For, Fgr, Uor, Ugr are used. Further, in the case of obtaining the values Uor, Ugr of the unit B corresponding to Uo, Ug set in the unit A, a ratio between an offset value, a gain value of factory setting and an offset value, a gain value of user setting is equal in the unit A of a succession origin and the unit B of a succession destination, so that the following formulas are acquired.

$$(Uo-Fo)/(Fg-Fo)=(Uor-For)/(Fgr-For) \quad\quad \text{formula (11)}$$

$$(Ug-Fo)/(Fg-Fo)=(Ugr-For)/(Fgr-For) \quad\quad \text{formula (12)}$$

When Uor, Ugr are obtained, the following formulas are acquired.

$$Uor=(Uo-Fo)*(Fgr-For)/(Fg-Fo)+For \quad \text{formula (5)}$$

$$Ugr=(Ug-Fo)*(Fgr-For)/(Fg-Fo)+For \quad \text{formula (6)}$$

Also, from another proportional relation, Uor, Ugr can be obtained also in the following formulas.

$$Uor=Fgr-(Fg-Uo)*(Fgr-For)/(Fg-Fo) \quad \text{formula (9)}$$

$$Ugr=Fgr-(Fg-Ug)*(Fgr-For)/(Fg-Fo) \quad \text{formula (10)}$$

That is, the formula (5), formula (6), formula (9) and formula (10) described above can be obtained.

Figure 5:
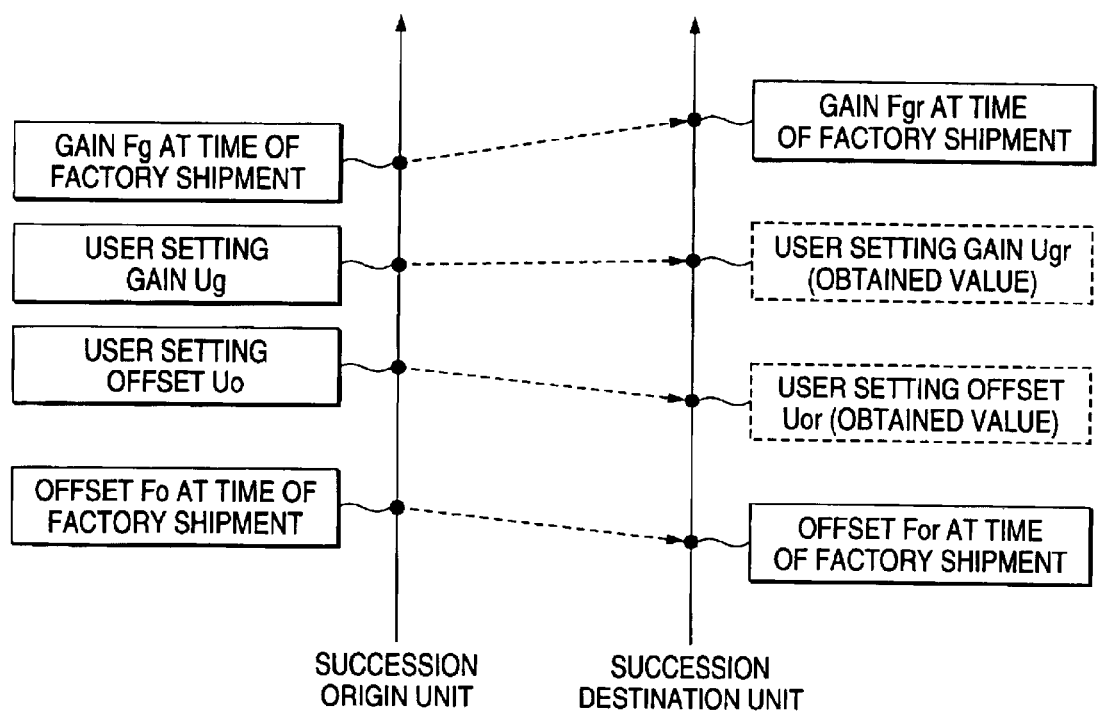
FIG. 5 is a diagram showing a relation of offset values and gain values between two units.

A relation of offset values and gain values between two units is shown in FIG. 5. In FIG. 5, ADC codes obtained at the time when a factory offset voltage, a factory gain voltage, a user offset voltage, a user gain voltage are applied between the units become values having variations depending on the units. However, its relative position relation is maintained. A user offset value Uor, a user gain value Ugr to be obtained can be obtained from this relative position relation.

Now, the fact that Uor can be obtained using any of the formula (5) and the formula (9) in order to obtain the user offset value Uor and Ugr can be obtained using any of the formula (6) and the formula (10) in order to obtain the user gain value Ugr has been described previously.

However, an ADC code obtained from the A/D conversion circuit 1 includes an error unique to the circuit originally. This error results from variations in characteristics in individual parts forming the A/D conversion circuit. In order to minimize an influence of this error, it is important to select which formula by which calculation is done.

Description of how the error originally included in the ADC code has an influence at the time of scaling will be made before discussing the errors of the formula (5), formula (6), formula (9) and formula (10).

In the formula (1) described above, an error δ (delta) is included in an ADC code obtained from the A/D conversion circuit 1. Thus, the formula (1) is changed to an formula to which δ is added as follows.

$$Sd=\{(Iadc+|\delta a|)-(Uo+|\delta b|)\}/\{(Ug+|\delta C|)-(Uo+|\delta b|)\}*Sg+So \quad \text{formula (13)}$$

δa, δb, δC show errors included in Iadc, Uo, Ug, respectively. Since the errors cannot be subtracted mutually, when the errors are added simply, the following formula is acquired.

$$Sd=\{(Iadc-Uo)+|\delta a+\delta b|\}/\{(Ug-Uo)+|\delta b+\delta C|\}*Sg+So$$

When δa≈δb≈δC→δ is used, the following formula is acquired.

$$Sd=\{(Iadc-Uo)+2\delta\}/\{(Ug-Uo+2\delta)\}*Sg+So$$

By 0>>δ, when δ of a denominator is omitted, the following formula is acquired.

$$Sd = \{(Iadc - Uo) + 2\delta\}/(Ug - Uo)*Sg + So \quad \text{formula (14)}$$
$$= \{(Iadc - Uo)\}/(Ug - Uo)*Sg + So +$$
$$2\delta/(Ug - Uo)*Sg$$

That is, a term of "{(Iadc−Uo)}/(Ug−Uo)*Sg+So" is a true value, and "2δ/(Ug−Uo)*Sg" becomes an error propagated after scaling processing.

When the formula (5) which is an offset correction formula is evaluated in like manner, the following formula is acquired.

$$Uor = \{(Uo + \delta d) - (Fo + \delta e)\}*\{(Fgr + \delta f) - (For + \delta g)\}/ \quad \text{formula (15)}$$
$$\{(Fg + \delta h) - (Fo + \delta e)\} + (For + \delta g)$$

δd, δe, δf, δh show errors included in Uo, Fo, Fgr, For, Fg, respectively. When δd≈δe≈δf≈δh→δ is used as the errors and similar operation is performed, the following formula is acquired.

$$Uor=(Uo-Fo+2\delta)*(Fgr-For+2\delta)/(Fg-Fo+2\delta e)+For+\delta$$

By 0>>δ, δ of a denominator is omitted. When δ2 is also omitted, the following formula is acquired.

$$Uor = (Uo - Fo)*(Fgr - For)/(Fg - Fo) +$$
$$For + 2|\delta\{(Fgr - For) + (Uo - Fo)\}/(Fg - Fo)| + |\delta|$$

By Fgr−For≈Fg−Fo, the following formula is acquired.

$$Uor = (Uo - Fo)*(Fgr - For)/(Fg - Fo) + \quad \text{formula (16)}$$
$$For + 2|\delta(Uo - Fo)/(Fg - Fo)| + 3|\delta|$$

That is, a term of "(Uo−Fo)*(Fgr−For)/(Fg−Fo)+For" is a true value, and "2|δ(Uo−Fo)/(Fg−Fo)|+3|δ|" becomes an error propagated at the time of offset value correction.

Similarly, the formula (9) is as follows.

$$Uor = Fgr - (Fg - Uo)*(Fgr - For)/(Fg - Fo) + \quad \text{formula (17)}$$
$$2|\delta(Fg - Uo)/(Fg - Fo)| + 3|\delta|$$

Figure 6:
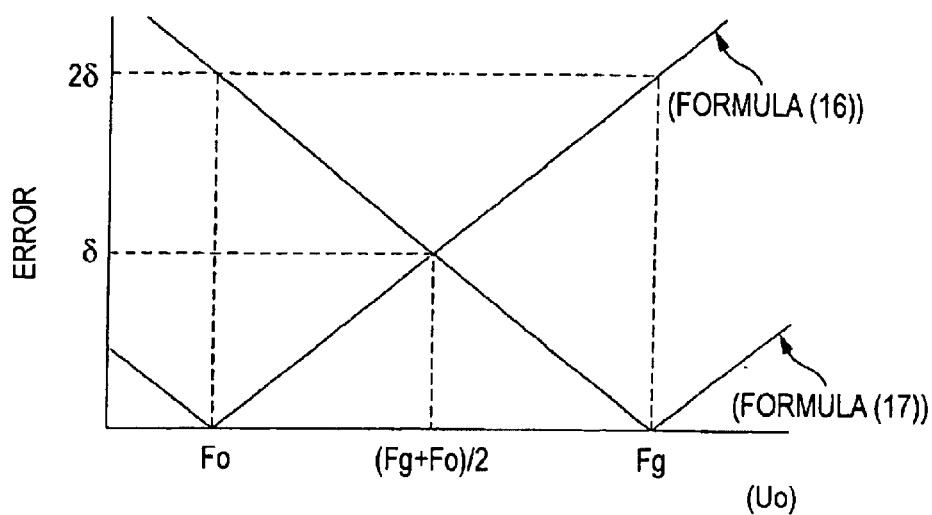
FIG. 6 is a graph schematized in order to compare errors respectively included in two kinds of mathematical formulas.

FIG. 6 is a schematized graph in which only 2|δ(Uo−Fo)/(Fg−Fo)| and 2|δ(Fg−Uo)/(Fg−Fo)| of the formula (16) and the formula (17) are respectively taken out and Uo is taken as the axis of abscissa and δ is taken as the axis of ordinate.

In order to minimize the error, it is found from FIG. 6 to be good to use the formula (16) if a value of Uo is smaller than (Fg+Fo)/2 and use the formula (17) if not.

The offset correction formula selection means 11 in the A/D conversion unit 4 is made to make this selection.

Also in the case of obtaining Ugr, operation is performed in a manner similar to the case of obtaining Uor.

$$Ugr = (Ug - Fo)*(Fgr - For)/(Fg - Fo) + \quad \text{formula (18)}$$
$$For + 3|\delta| + 2|\delta(Ug - Fo)/(Fg - Fo)|$$

$$Ugr = Fgr - (Fg - Ug)*(Fgr - Ugr)/(Fg - Fo) + \quad \text{formula (19)}$$
$$3|\delta| + 2|\delta(Fg - Ug)/(Fg - Fo)|$$

Figure 7:
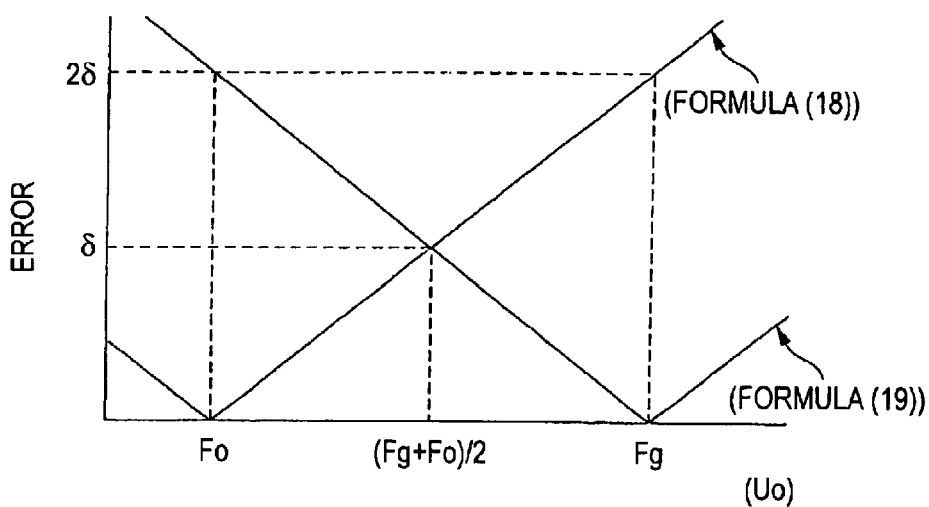
FIG. 7 is a graph schematized in order to compare errors respectively included in two kinds of mathematical formulas.

FIG. 7 is a schematized graph in which only 2|δ(Ug−Fo)/(Fg−Fo)| and 2|δ(Fg−Ug)/(Fg−Fo)| of the formula (18) and the formula (19) are respectively taken out and Uo is taken as the axis of abscissa and δ is taken as the axis of ordinate.

In order to minimize the error, it is found from FIG. 7 to be good to use the formula (18) if a value of Ug is smaller than (Fg+Fo)/2 and use the formula (19) if not.

The gain correction formula selection means 12 in the A/D conversion unit 4 is made to make this selection.

Based on the theory described above, a succession destination unit uses parameters of Uor, Ugr and thereby a slight deviation from Uo, Ug which are parameters of a succession origin is corrected automatically and an effect similar to the case of calibration manually by one channel can be obtained.

Using a mechanism of the saving and restoration of the user range described above, the case that plural A/D conversion units are present on the same system (for example, an FA system) and setting of a user offset value and a user gain value is copied from one unit of the units in which a user offset value and a user gain value are set already to the other plural units with no setting will be described briefly.

Figure 8:
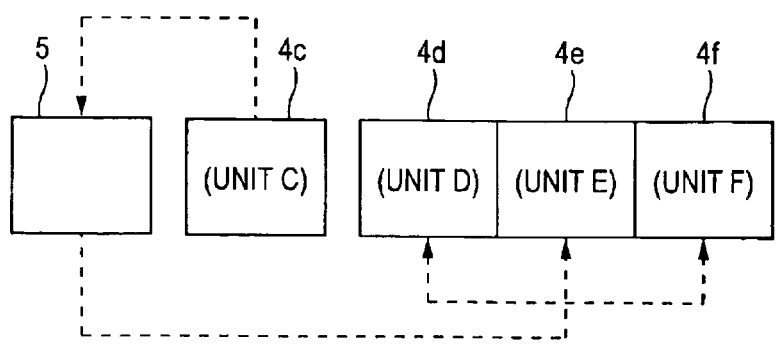
FIG. 8 is a block diagram showing an analog unit system including plural A/D conversion units according to the first embodiment of this invention.

FIG. 8 is a block diagram of its embodiment. One central control unit 5 such as a sequencer is prepared and plural A/D conversion units are prepared on the same system. In FIG. 8, an A/D conversion unit 4c (unit C) in which a user range is preset already and A/D conversion units 4d, 4e, 4f (units D, E, F) with no setting are present on the same system. A user range is once saved from the unit C to the central control unit 5 and data of the user range is restored to the units D, E and F.

Figure 9:
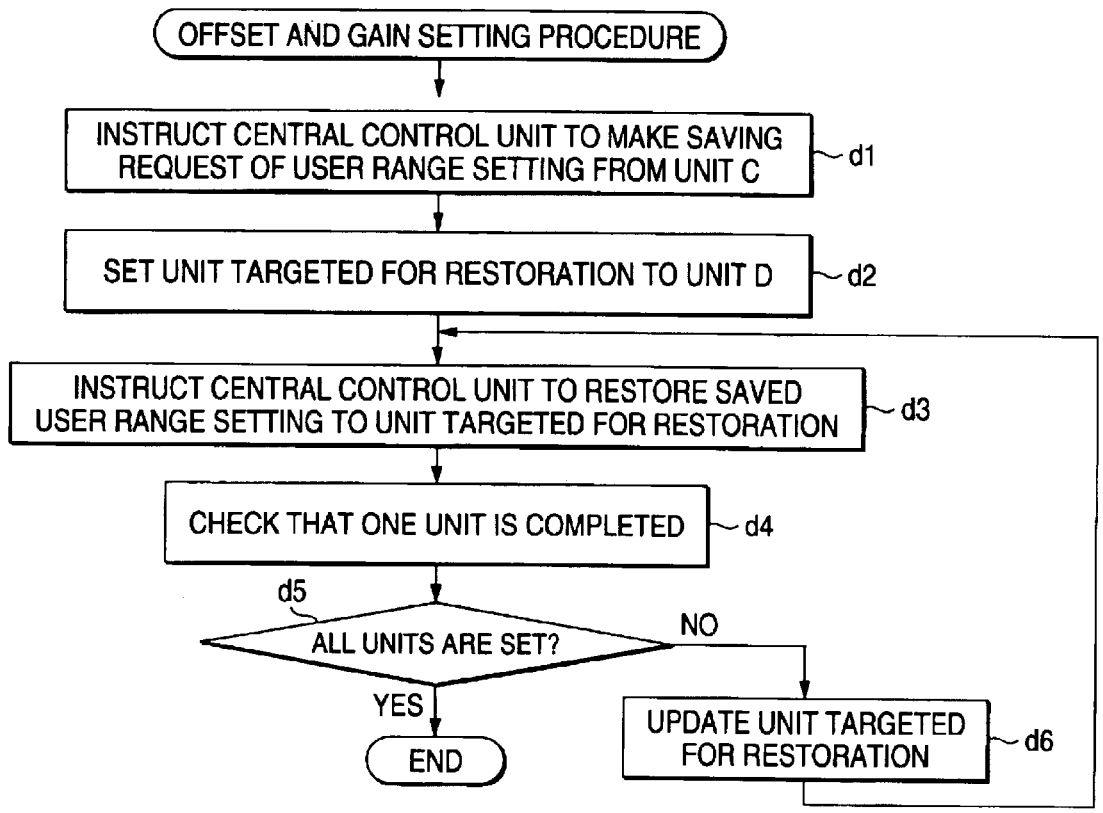
FIG. 9 is a flowchart showing a setting procedure of an offset value and a gain value in the system shown in FIG. 8.

FIG. 9 is a flowchart showing a setting procedure of a user offset value and a user gain value in the system shown in FIG. 8.

In the flowchart of FIG. 9, in step d1, a user first instructs the central control unit 5 to make a saving request of user range setting from the unit C.

Next, in step d2, the unit D targeted for restoration is set. Setting of the unit targeted for restoration is allocated on, for example, the device memory 6b in the central control unit 5 and is made by a sequence program. By sequentially updating this unit targeted for restoration, restoration processing of the plural A/D conversion units is performed.

Then, in step d3, the central control unit 5 is instructed to restore the user range setting saved to the central control unit 5 to the A/D conversion unit targeted for restoration. An action as shown in the block diagram (FIG. 8) of user range restoration is performed in the inside of the unit targeted for restoration and the central control unit 5 such as the sequencer.

Then, in step d4, the user checks that one unit is completed from a completion status.

Then, in step d5, the sequence program decides whether or not all the units (in this case, the units D, E, F) are set. When there is the unit in which the setting is not processed yet, the flowchart proceeds to step d6 and the unit targeted for restoration is updated. Then, processing from step d3 is again performed with respect to the updated unit targeted for restoration.

When the sequence program decides that all the units are set in the decision in step d5, user range restoration processing is ended.

A series of processing can be automated by the sequence program of the central control unit 5.

The system shown in FIG. 8 assumes the case of making the same user range setting in large amounts when a set maker mainly mounts plural A/D conversion units to a system of my company product. In comparison with a conventional procedure of user range setting, user range setting can be made simultaneously in a batch manner with respect to the plural A/D conversion units, and a reduction in time and laborsaving of user range setting work can be achieved. This has the large effect as the system with a large number of A/D conversion units becomes large.

Second Embodiment

There is shown an example of the case that one A/D conversion unit is present on an FA system and when this A/D conversion unit is removed in system operation and is replaced with another A/D conversion unit, user range setting is saved from the another A/D conversion unit before the removal and after the removal, the user range setting is restored when another A/D conversion unit is mounted.

Figure 10:
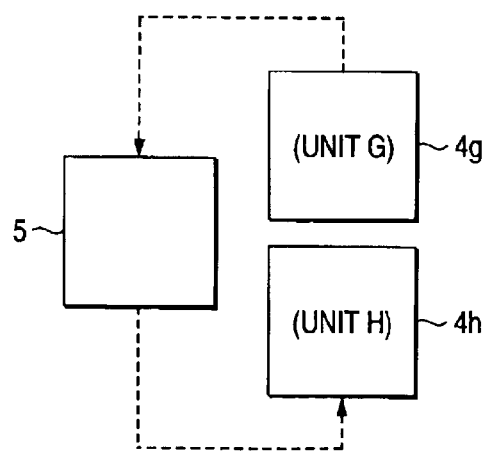
FIG. 10 is a block diagram showing an analog unit system including plural A/D conversion units according to a second embodiment of this invention.

FIG. 10 shows the system by a block diagram. A central control unit 5 such as a sequencer and respective A/D conversion units 4 targeted for saving and restoration of user range setting are prepared on the same system. In FIG. 10, there is an A/D conversion unit 4g (unit G) in which a user range is preset already and the unit G is removed in system operation and is replaced with another A/D conversion unit 4h (unit H). In that case, data for user range setting present in the unit G is saved to the central control unit 5 and is restored at the time of mounting the unit H.

Figure 11:
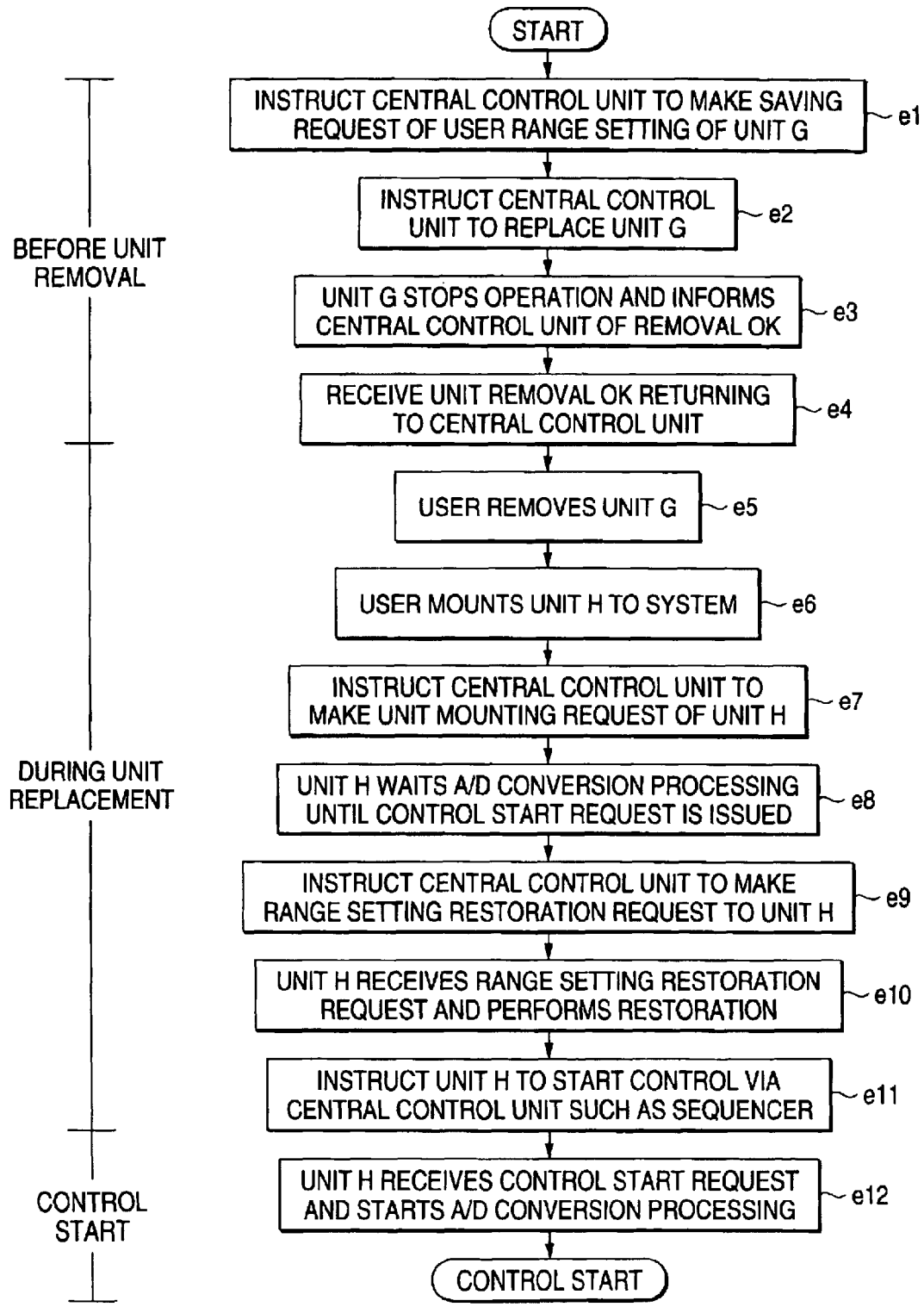
FIG. 11 is a flowchart showing a replacement procedure of the A/D conversion unit according to the second embodiment of this invention.

FIG. 11 is a flowchart showing a replacement procedure from the unit G to the unit H in system operation in this embodiment.

In the flowchart of FIG. 11, in step e1, a user first instructs the central control unit 5 to make a saving request of user range setting of the unit G.

By this processing, the user range setting set in the unit G is saved to the central control unit 5.

Next, in step e2, the user instructs the central control unit 5 to replace the unit G.

Then, in step e3, the unit G receives instructions of the unit replacement to stop operation and informs the central control unit 5 of a unit removal OK status. The unit G stops operation in this stage in preparation for removal of the next step.

Then, in step e4, the user receives the unit removal OK status returning to the central control unit 5 such as the sequencer.

Thereafter, the user detaches external wiring of the unit G and removes the unit G itself (step e5), and then mounts the unit H to the system and performs external wiring of the unit H (step e6). Further, the central control unit 5 is instructed to make a unit mounting (unit starting) request of the unit H (step e7).

Then, in step e8, the unit H waits A/D conversion processing until a rise control start request is issued from the central control unit 5 in a wait state.

Then, in step e9, the user instructs the central control unit 5 to make a range setting restoration request to the unit H mounting user range setting data in which the saving request is made from the unit G after checking a rise in step e8.

By this processing, the unit H completes the user range setting.

Then, in step e10, the unit H receives a user range setting restoration request from the central control unit 5 and performs restoration.

Then, in step e11, the user instructs the unit H to start control via the central control unit 5.

Finally, in step e12, the unit H receives a control start request from the user via the central control unit 5 and starts the A/D conversion processing.

In this embodiment, for example, the case that a field user actually using the FA system including the A/D conversion unit replaces only the particular A/D conversion unit without stopping the entire system is assumed. In comparison with a conventional procedure of user range setting, there is no need to stop the entire system, so that operating efficiency of the entire FA system can be increased.

Third Embodiment

There is shown an embodiment in which, for example, plural A/D conversion units are present on an FA system and range setting is switched according to the case without stopping the entire FA system and operation can instantaneously be performed.

Figure 12:
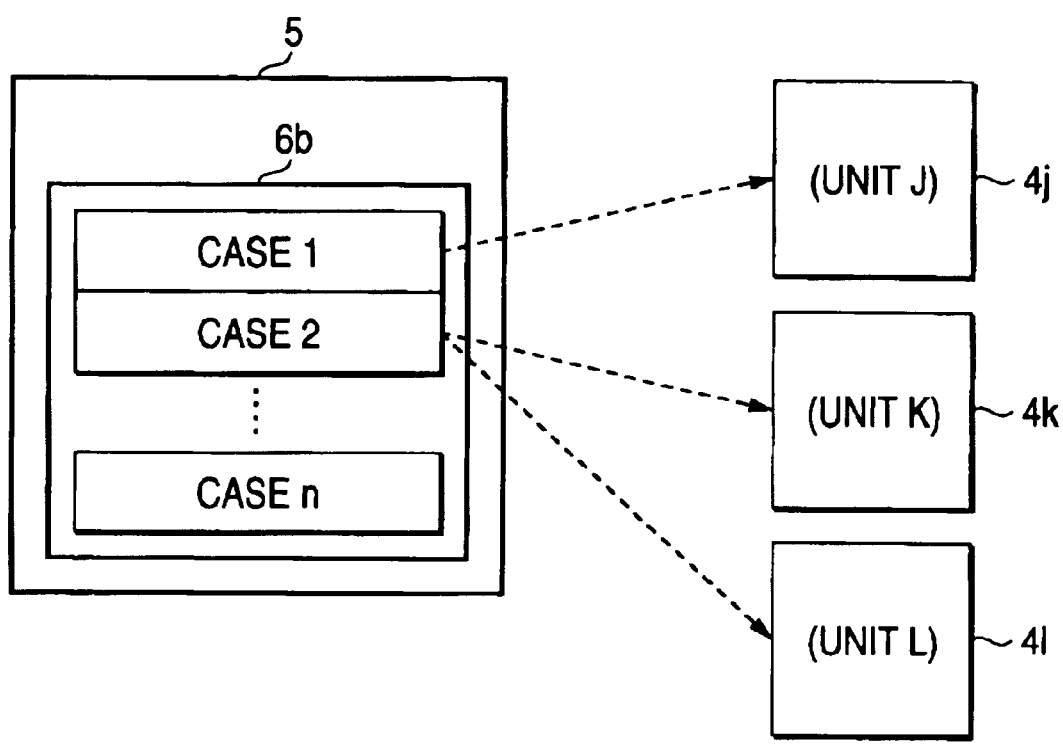
FIG. 12 is a block diagram showing an analog unit system including plural A/D conversion units according to a third embodiment of this invention.
Figure 13:
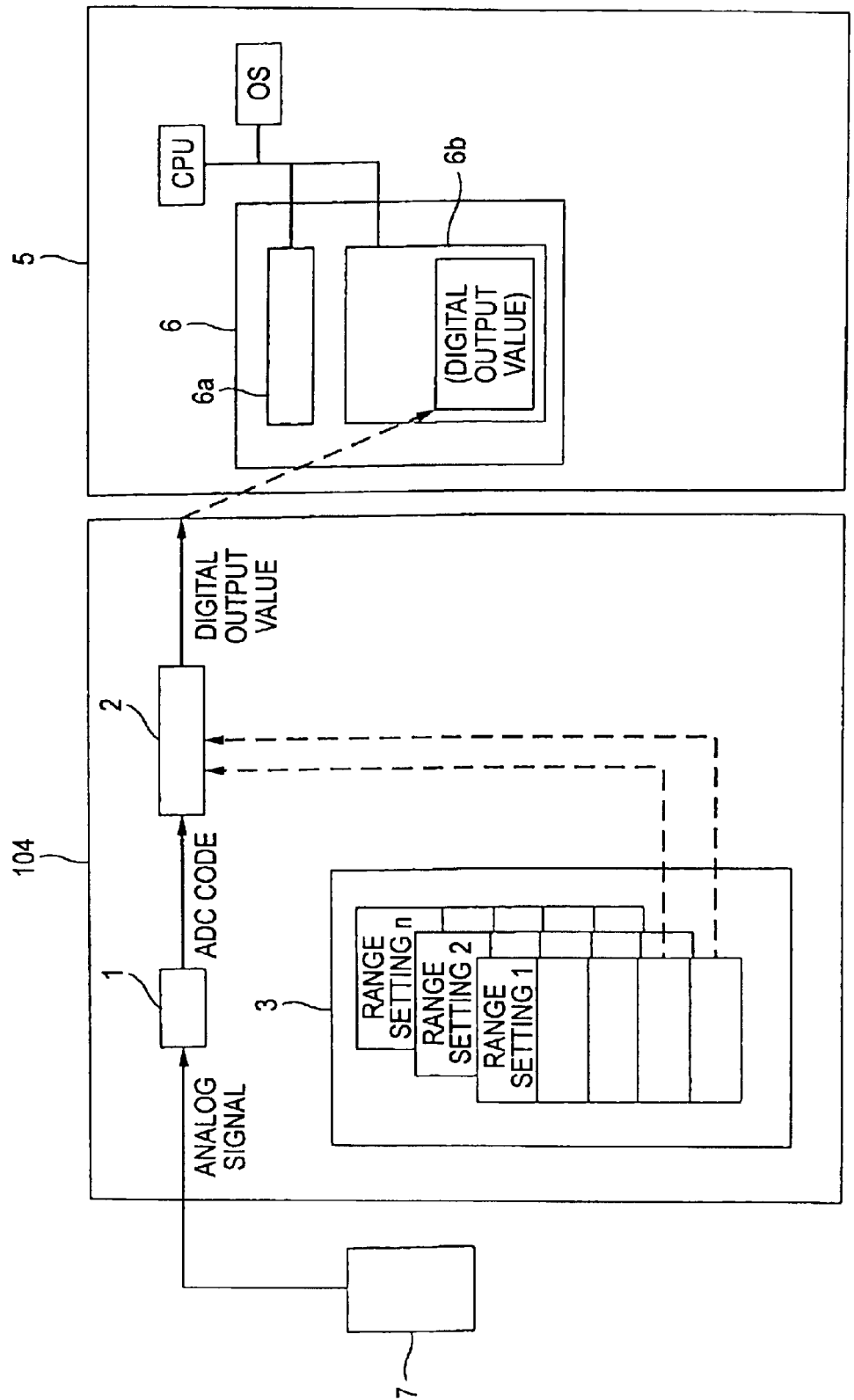
FIG. 13 is a block diagram showing a conventional analog unit system.
Figure 14:
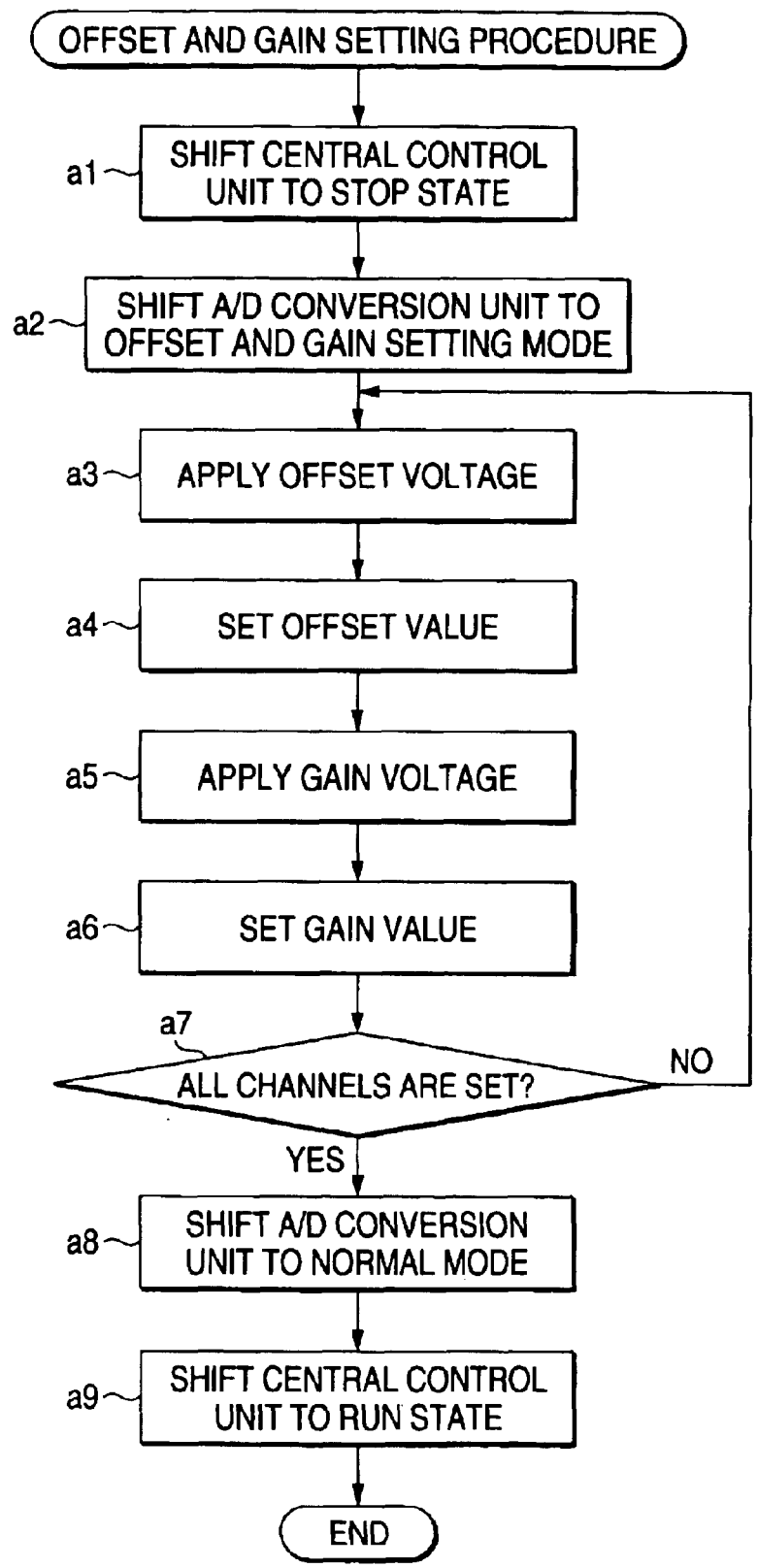
FIG. 14 is a flowchart showing a conventional setting procedure of an offset value and a gain value.

FIG. 12 shows the system by a block diagram.

A central control unit 5 and plural A/D conversion units 4j, 4k, 4l (units J, K, L) targeted for saving and restoration of user range setting are prepared on the same system. In this embodiment, data of input ranges from a case 1 to a case n is previously held in device memory 6b. This data of input ranges is stored in the units J, K, L present on the system to perform operation.

Data of input ranges which are not set on standards is prepared, for example, an input range of −1 to 10 V is used in a case 1 and an input range of −1 to 5 V is used in a case 2, and the data is set to the A/D conversion units immediately before use.

In a conventional method, every time, the entire system is stopped and setting of an offset value and a gain value is made or switching is performed only within the input ranges held in each of the A/D conversion units to make use and on the contrary, in a method of this embodiment, the device memory 6b in the central control unit 5 such as a sequencer can be used as storage means of data. As a result of this, data of multiple input ranges can be preserved and switched. Also, simultaneous batch setting of data of input ranges with respect to the plural A/D conversion units can be made.

Industrial Applicability

As described above, an analog unit system according to this invention is suitable for use in cases etc. for replacing only a desired analog unit in an FA system etc. into which multiple analog units are incorporated.

What is claimed is:

1. An analog unit system comprising:
   a first analog unit having first storage means for storing a first factory setting value and a first user setting value; and
   second storage means for reading the first factory setting value and the first user setting value out of the first storage means and storing the setting values,
   wherein the analog unit converts analog signals into digital values adjusted by at least one of the first factory setting value and the first user setting value.

2. An analog unit system comprising:
   a first analog unit having first storage means for storing a first factory setting value and a first user setting value;
   second storage means for reading the first factory setting value and the first user setting value out of the first storage means and storing the setting values;
   operation means for calculating a second user setting value based on the first factory setting value and the first user setting value read out of the second storage means; and
   a second analog unit having third storage means for storing the second user setting value calculated by the operation means.

3. An analog unit system as claimed in claim 2, further comprising a plurality of second analog units and a second user setting value is supplied to the plurality of second analog units in a batch manner.

4. The analog unit system as claimed in claim 1, wherein the first factory setting comprises a lowest analog value inputted into a particular channel of the analog unit.

5. The analog unit system as claimed in claim 1, wherein the analog unit further comprises a conversion circuit for converting the analog signals into an ADC code and a scaling means for calibrating said ADC code using said setting values from said second storage means and for outputting the digital signals.

6. The analog system unit as claimed in claim 1, further comprising operation means for calculating a second user setting value based on the first factory setting value and the first user setting value read out of the second storage means.

7. The analog system unit as claimed in claim 1, further comprising a plurality of second analog units and means for supplying the second user setting value to the plurality of second analog units in a batch manner.

8. A method of converting an analog signal into a digital value comprising:
   storing a first factory setting value and a first user setting value in a first analog unit;
   calculating a second user setting value based on the first factory setting value and the first user setting value;
   storing the second calculated user setting value; and
   converting the analog signal into the digital value using the second calculated user setting value.

* * * * *